US009367659B2

(12) United States Patent
Saghizadeh et al.

(10) Patent No.: US 9,367,659 B2
(45) Date of Patent: Jun. 14, 2016

(54) COMPLEX LAYOUT-BASED TOPOLOGICAL DATA ANALYSIS OF ANALOG NETLISTS TO EXTRACT HIERARCHY AND FUNCTIONALITY

(71) Applicant: Raytheon Company, Waltham, MA (US)

(72) Inventors: Parviz Saghizadeh, Los Angeles, CA (US); Thomas Allen Spargo, Colorado Springs, CO (US); Robert T. Narumi, Yorba Linda, CA (US); Mark W. Redekopp, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 23 days.

(21) Appl. No.: 14/454,386

(22) Filed: Aug. 7, 2014

(65) Prior Publication Data

US 2015/0100928 A1    Apr. 9, 2015

Related U.S. Application Data

(60) Provisional application No. 61/887,937, filed on Oct. 7, 2013.

(51) Int. Cl.
*G06F 17/50* (2006.01)
(52) U.S. Cl.
CPC .......... *G06F 17/505* (2013.01); *G06F 17/5045* (2013.01); *G06F 17/5063* (2013.01)
(58) Field of Classification Search
CPC ............................ G06F 17/5045; G06F 17/505
USPC ......................... 716/103–104, 106
See application file for complete search history.

(56) References Cited

U.S. PATENT DOCUMENTS

| | | | |
|---|---|---|---|
| 4,651,284 A | 3/1987 | Watanabe et al. | |
| 5,867,395 A | 2/1999 | Watkins et al. | |
| 6,018,749 A * | 1/2000 | Rivette ............... | G06F 13/4063 707/E17.008 |
| 6,077,717 A | 6/2000 | McBride | |
| 6,308,301 B1 | 10/2001 | McBride et al. | |
| 6,536,018 B1 * | 3/2003 | Chisholm ........... | G06F 17/5045 716/136 |
| 6,895,524 B2 * | 5/2005 | Korobkov ........... | G06F 17/5022 703/14 |
| 7,272,805 B2 * | 9/2007 | McGaughy ......... | G06F 17/5045 716/103 |
| 7,797,659 B2 * | 9/2010 | Chetput ............. | G06F 17/5018 716/126 |

(Continued)

FOREIGN PATENT DOCUMENTS

WO    WO-2012/140540 A1    10/2012
WO    WO-2015053851 A1    4/2015

(Continued)

OTHER PUBLICATIONS

"U.S. Appl. No. 14/454,343, Non Final Office Action mailed Apr. 9, 2015", 15 pgs.

(Continued)

*Primary Examiner* — Stacy Whitmore
(74) *Attorney, Agent, or Firm* — Schwegman Lundberg & Woessner, P.A.

(57) ABSTRACT

A system and method for reverse synthesizing an integrated circuit from a netlist. A netlist extracted from a device under review is received and converted to a connected graph. Blocks of cells are identified within the connected graph and a circuit model is formed from the blocks of cells, wherein forming includes iteratively building more complex blocks of cells from simpler blocks of cells.

25 Claims, 20 Drawing Sheets

(56) References Cited

U.S. PATENT DOCUMENTS

| | | | | |
|---|---|---|---|---|
| 7,937,678 | B2* | 5/2011 | Lippmann | G06F 17/505 716/103 |
| 8,413,085 | B2 | 4/2013 | Green | |
| 8,443,329 | B2* | 5/2013 | McConaghy | G06F 17/5063 703/22 |
| 8,464,191 | B2* | 6/2013 | McIlrath | G06F 17/5081 716/107 |
| 8,516,412 | B2* | 8/2013 | Cho | G06F 17/505 716/100 |
| 8,701,058 | B2* | 4/2014 | Zavadsky | G06F 17/5022 716/104 |
| 8,788,990 | B2* | 7/2014 | Meserve | G06F 17/505 716/100 |
| 8,793,630 | B2* | 7/2014 | Ge | G06F 17/5068 716/108 |
| 9,026,517 | B2* | 5/2015 | Yanagisawa | G06F 17/30477 707/706 |
| 2003/0208721 | A1* | 11/2003 | Regnier | G06F 17/5022 716/106 |
| 2006/0101443 | A1* | 5/2006 | Nasr | G06F 8/71 717/163 |
| 2006/0112356 | A1* | 5/2006 | McGaughy | G06F 17/5045 716/103 |
| 2008/0184181 | A1* | 7/2008 | Chetput | G06F 17/5018 716/136 |
| 2009/0313596 | A1* | 12/2009 | Lippmann | G06F 17/505 716/126 |
| 2010/0325593 | A1 | 12/2010 | Zavadsky et al. | |
| 2012/0221990 | A1* | 8/2012 | Dai | G06F 17/5045 716/112 |
| 2012/0260224 | A1 | 10/2012 | Green | |
| 2012/0266121 | A1* | 10/2012 | Newcomb | G06F 17/5036 716/109 |
| 2013/0007676 | A1 | 1/2013 | Motiani et al. | |
| 2013/0047133 | A1* | 2/2013 | Alam | G06F 17/5045 716/136 |
| 2013/0185683 | A1* | 7/2013 | Lee | G06F 17/5036 716/103 |
| 2013/0275929 | A1* | 10/2013 | Suzuki | G06F 17/505 716/104 |
| 2015/0100929 | A1* | 4/2015 | Redekopp | G06F 17/5045 716/103 |

FOREIGN PATENT DOCUMENTS

| | | |
|---|---|---|
| WO | WO-2015053852 A1 | 4/2015 |
| WO | WO-2015053852 A9 | 4/2015 |

OTHER PUBLICATIONS

"International Application Serial No. PCT/US2014/050139, International Search Report mailed Jan. 30, 2015", 6 pgs.

"International Application Serial No. PCT/US2014/050139, Invitation to Pay Additional Fees and Partial Search Report mailed Nov. 19, 2014", 7 pgs.

"International Application Serial No. PCT/US2014/050139, Written Opinion mailed Jan. 30, 2015", 9 pgs.

"International Application Serial No. PCT/US2014/050180, International Search Report mailed Oct. 16, 2014", 4 pgs.

"International Application Serial No. PCT/US2014/050180, Written Opinion mailed Oct. 16, 2014", 8 pgs.

Bouchaour, Hamza, et al., "Towards a method for VLSI circuit reverse engineering", *Proceedings of the Third International Conference on Computer Science and its Applications(CIIA'11)*. [online]. [retrieved on Oct. 7, 2014]. Retrieved from the Internet: <URL: http://ceur-ws.org/Vol-825/paper_4.pdf>, (Dec. 13, 2011), 5 pgs.

Shi, Yiqiong, et al., "Extracting functional modules from flattened gate-level netlist", *2012 International Symposium on Communications and Information Technologies (ISCIT)*, (2012), 538-543.

Singh, K J, et al., "Extracting RTL Models from Transistor Netlists", *1995 IEEE/ACM International Conference on Computer-Aided Design (ICCAD-95)*, (1995), 11-17.

Subramanyam, Pramod, et al., "Reverse Engineering Digital Circuits Using Functional Analysis", *Design, Automation & Test in Europe Conference & Exhibition (DATE)*, (2013), 1277-1279.

Wenchao, Li, et al., "Reverse Engineering Circuits Using Behavioral Pattern Mining", 2012 *IEEE International Symposium on Hardware-Oriented Security and Trust*, (2012), 83-88.

White, J. L., et al., "Efficient Algorithms for Subcircuit Enumeration and Classification for the Module Identification Problem", *Proceedings, 2001 International Conference on Computer Design (ICCD)*, (2001), 519-522.

"U.S. Appl. No. 14/454,343, Final Office Action mailed Jul. 31, 2015", 19 pgs.

"U.S. Appl. No. 14/454,343, Response filed Jul. 9, 2015 to Non Final Office Action mailed Apr. 9, 2015", 16 pgs.

* cited by examiner

| TIER | LOW LEVEL BLOCKS | MID LEVEL BLOCKS | HIGH LEVEL BLOCKS |
|---|---|---|---|
| 1 | OP-AMP<br>COMPARATOR<br>AMPLIFIER<br>LNA<br>POWER AMPLIFIER<br>MIXER<br>VCO<br>FILTER<br>PHASE SHIFTER<br>OSCILLATOR | PLL<br>A/D CONVERTER<br>DAC<br>V TO I CONVERTER (USING AN OP-AMP)<br>I TO V CONVERTER (USING AN OP-AMP)<br>VOLTAGE REGULATOR | RECEIVER<br>TRANSMITTER<br>TRANSCEIVER<br>PLL<br>MODULATOR<br>DEMODULATOR<br>DDS |
| 2 | BANDGAP<br>CURRENT REFERENCE<br>VOLTAGE REFERENCE<br>CHARGE PUMP<br>PROTECTION (ESD & CLAMP)<br>ATTENUATOR<br>TRACK AND HOLD OR SAMPLE AND HOLD<br>R2R LADDER<br>ADC FOLDING BLOCK<br>ANALOG MUX & SWITCHES<br>CML LATCH & DFF<br>LINE DRIVER<br>LEVEL SHIFTER/ TRANSLATORS<br>LVDS CELL<br>SCHMITT TRIGGER<br>BUFFER<br>EMITTER/SOURCE FOLLOWER BUFFER<br>PHASE DETECTOR | ACTIVE FILTERS (USING OTAS &/OR OP-AMPS)<br><br>SWITCH-CAPACITOR FILTERS (USING OTAS &/OR OP-AMPS)<br><br>TRACK AND HOLD (USING OTAS &/OR OP-AMPS)<br><br>LIMITERS (USING OTAS &/OR OP-AMPS)<br><br>REGULATORS (USING OTAS &/OR OP-AMPS)<br><br>VCOS (USING OTAS &/OR OP-AMPS)<br><br>OCILLATORS (USING OTAS &/OR OP-AMPS) | |
| 3 | VGA<br>DRIVER CIRCUITS<br>LIMITER<br>GAIN CONTROL<br>FREQUENCY DIVIDERS<br>FREQUENCY MULTIPLIERS<br>I TO V<br>V TO I<br>LINEAR POWER DETECTORS<br>LOG POWER DETECTORS<br>ACTIVE PHASE SHIFTERS<br>GYRATORS AND MORE COMPLEX LOADS | | |

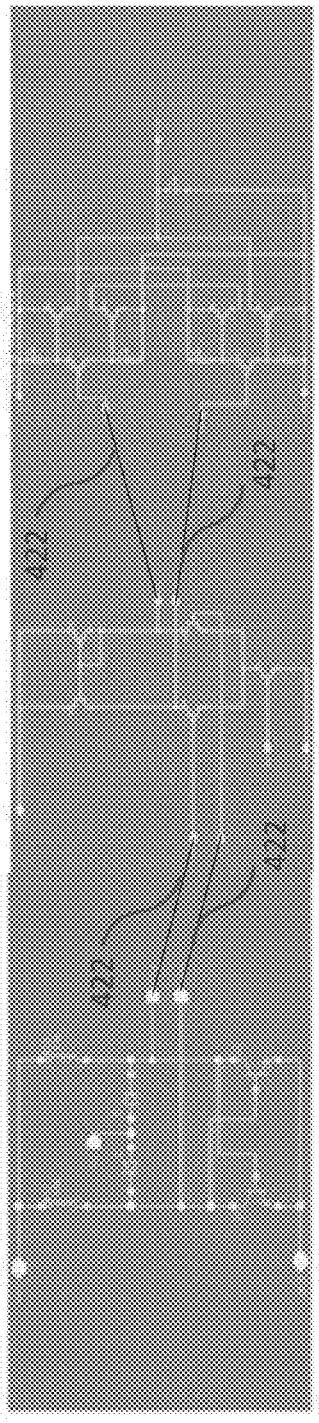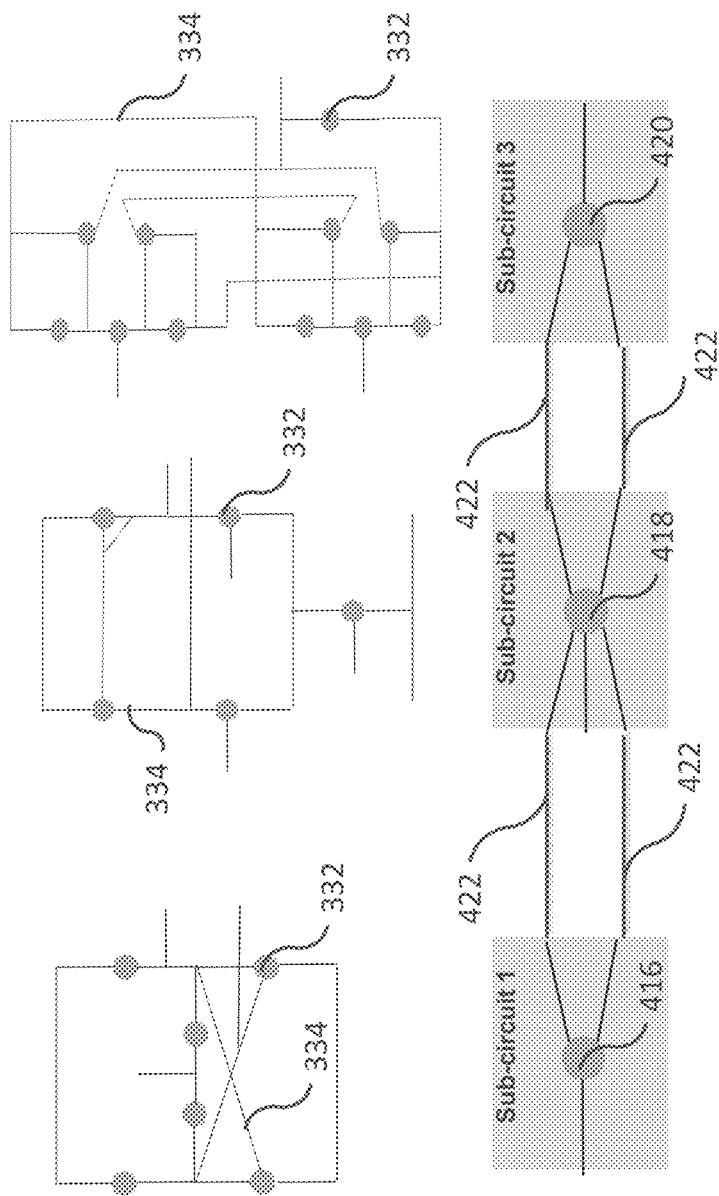
FIG. 8

| 472 | 474 | 476 |
|---|---|---|
| Low level circuit | Number of occurrences | Description |
| 1 cmos_cascode_4_1 | 2 | |
| 2 and_gate_2 | 18 | |
| 3 nand_gate_3 | 56 | |
| 4 or_gate_2 | 11 | |
| 5 buf_cascode_inv_2_50p | 121 | |
| 6 nand_gate_2 | 74 | |
| 7 cmos_inv_1_sso | 135 | |
| 8 cc_nand2_1 | 94 | |
| 9 bias_generator_p1_1 | 16 | |
| 10 analog_mux_4to1_1 | 119 | |
| 11 v_to_i_simple_1_dido | 1 | |
| 12 current_reference_basic_low_voltage_1_half | 14 | |
| 13 analog_mux_2to1_1 | 27 | |
| 14 current_reference_basic_5_half | 46 | |
| 15 | | Registers |
| 16 | | Current Steering Segment  6  Binary weighted DAC segment |
| 17 | | Current Steering Segment  16  Thermometer weighted DAC segment |
| 18 | | Bias Generator  Biasing Circuitry |
| Total Low Level Blocks | 734 | |

*FIG. 10*

| Item | IP Cell Name | QTY | IP References | IP References QTY | IP References Qty+Share |
|---|---|---|---|---|---|
| 1 | mux21_pt_1 | 5 | | | |
| 2 | and_gate_2 | 1 | | | |
| 3 | nand_gate_3 | 15 | | | |
| 4 | or_gate_2 | 2 | | | |
| 5 | nand_gate_3 | 100 | | | |
| 6 | nor_gate_2 | 1 | | | |
| 7 | inv_1_siso | 279 | | | |
| 8 | xnor2_gate_1 | 2 | | | |
| 9 | xor_8b1_part | 5 | | | |
| 10 | analog_mux_4to1_1 | 93 | | | |
| 11 | v_to_i_simple_1_dido | 2 | | | |
| 12 | current_reference_basic_low_voltage_1_half | 1 | | | |
| 13 | analog_mux_2to1_1 | 36 | | | |
| 14 | sample_and_hold_simple_1_dido | 3 | | | |
| 15 | current_reference_basic_5_half | 19 | | | |
| 16 | c_unary_ladder_2div_1_so | 4 | | | |
| 17 | filter_1storder_rc_hp_1_siso | 1 | | | |
| 18 | current_reference_basic_helper_1_half | 5 | | | |

*FIG. 12A*

| Rank | Low Level Blocks | Qty | Mid Level Blocks | Qty | High Level Blocks | Qty |
|---|---|---|---|---|---|---|
| 19 | Chargepump_simple_3_siso | 1 | Charge Pump | 1 | | |
| 20 | Custom Green cell | 26 | Freq Divider Segment | 8 | Freq Divider | 1 |
| 21 | Custom Blue cell | 8 | Freq Divider Segment | 8 | Freq Divider | 1 |
| 22 | Custom Orange cell | 5 | Freq Divider Segment | 8 | Freq Divider | 1 |
| 23 | Custom Purple Cell | 44 | Freq Divider Segment | 8 | Freq Divider | 1 |
| 24 | Inverter | 7 | Digital switch segment | 7 | VCO | 1 |
| 25 | Custom MOS_Cap cell | 7 | Digital switch segment | 7 | VCO | 1 |
| 26 | Custom vco_cc | 1 | Digital switch segment | 7 | VCO | 1 |
| | Total Low Level Blocks | 673 | | | | |

FIG. 12B

V_to_I_simple_1_dido

Analog_Mux_4to1_1

COMPLEX LAYOUT-BASED TOPOLOGICAL DATA ANALYSIS OF ANALOG NETLISTS TO EXTRACT HIERARCHY AND FUNCTIONALITY

CLAIM OF PRIORITY

This application claims the benefit of U.S. Provisional Patent Application Ser. No. 61/887,937, filed on Oct. 7, 2013, the content of which is incorporated herein by reference in its entirety.

GOVERNMENT RIGHTS

The United States Government may have rights in this invention as provided under contract HR0011-11-C-0058 awarded by the Department of Defense.

BACKGROUND

As products age, it becomes increasingly difficult to obtain parts needed to repair the products. Sometimes, it is necessary to reverse engineer an integrated circuit (IC).

Destructive and non-destructive techniques such as SEM imaging, IR and X-ray techniques can be used to image an integrated circuit (IC) but these techniques produce only a low level netlist that represents the circuitry in the IC. Such a netlist is a raw netlist at the element level, i.e., resistor, capacitor, inductor and transistor levels. For large and complex ICs it is extremely hard if not impossible to understand this low level netlist in its raw form. In order to understand the functionality of the IC or whether the IC is compromised, the netlist needs to be converted to a higher level netlist. Currently, there are no automated techniques to extract hierarchy and functionality from an element level netlist.

BRIEF DESCRIPTION OF THE DRAWINGS

FIG. 6 illustrates low to high level analog blocks.

FIG. 8 is a graphical representation of analog circuits and of a mapping of circuit elements to subcircuit nodes.

FIG. 10 illustrates a list of circuit blocks extracted from an analog netlist using the proposed technique.

FIGS. 12a and b illustrate a list of circuit blocks extracted from an analog netlist using reverse synthesis.

DETAILED DESCRIPTION

The following description and the drawings illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As noted above, the element (R,L,C,Tx) level netlist for large and complex ICs is not human readable and is extremely difficult to understand. In order to understand the functionality of the IC or whether the IC is compromised, the netlist needs to be converted to a higher level abstraction. In one approach this is done through a reverse synthesis process based on Structural Auto Cell Identification followed by Layout-based Pattern Matching techniques. In some embodiments, the low element level netlist is converted to the graphical domain and enhanced with the placement information of all elements within the integrated circuit. Topological analysis is then used to identify shapes and patterns in the integrated circuit.

Figure 1:
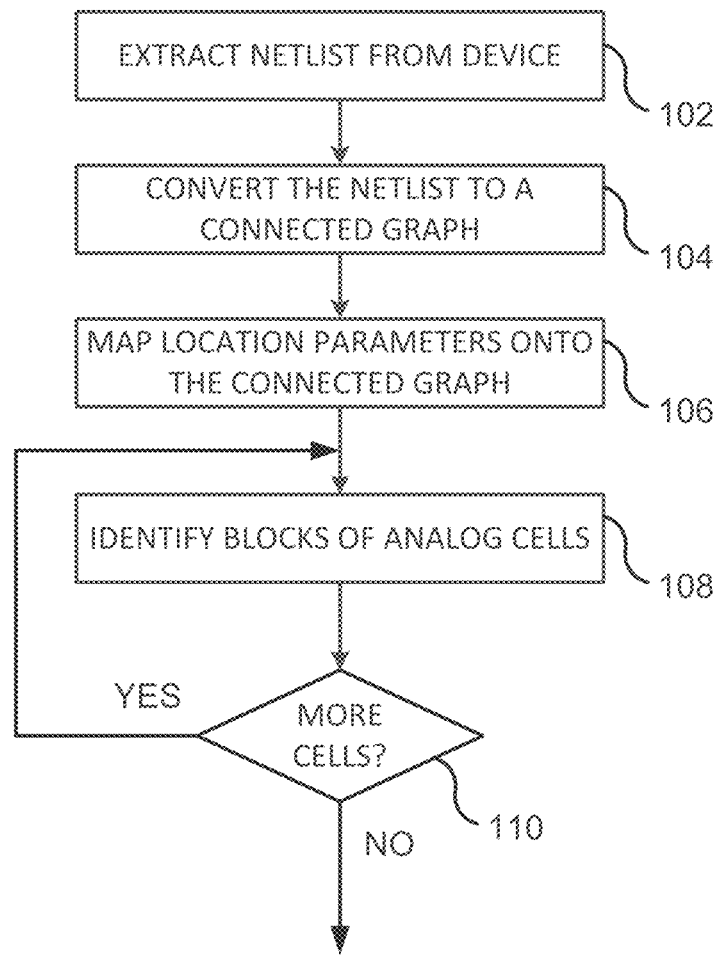
FIG. 1 illustrates a reverse synthesis method.

One such reverse synthesis method for integrated circuits having analog circuits is shown in FIG. 1. In the example embodiment shown in FIG. 1, at 102, a netlist is extracted from a device under review and converted at 104 to a connected graph. Location information is added to the graph at 106 to form a location enhanced graph. In one embodiment, circuit elements are converted to nodes with unique IDs and attributes representing type of element, symmetry of input/output terminals, number of terminals, and XYZ spatial layout coordinates. Topological data analysis is performed at 108 to identify blocks of analog cells within the location enhanced connected graph. More complex blocks of analog cells are built iteratively from simpler blocks of analog cells at 110 in order to build a circuit model.

In one embodiment, the low element level netlist is converted to graphs with each element or net (wire) being represented by a node (vertex) in the graph. Each node is assigned attributes that describe and constrain the element it represents. In some embodiments, the attributes include type of element, symmetry of input/output terminals or lack thereof, number of terminals and XYZ spatial layout coordinates.

For some embodiments, the spatial XYZ coordinates for each element are overlayed from the netlist and are attached to each node as a spatial coordinate attribute. The connections between nets and circuit elements are represented by edges (connections) between nodes in the graph.

Topological data analysis on the resulting graphical representation of the integrated circuit is used to locate and identify simple to complex patterns in order to extract hierarchy and functionality from the netlist. The recursive data analysis searches for patterns and shapes and performs pattern matching to analog blocks described in reference libraries. When a pattern is matched both the netlist and other library cells are updated simultaneously to incorporate the new hierarchy that represents the matched block. Top-down and bottom-up approaches are used to extract hierarchy and functionality. In both approaches, large jumps in XY coordinates between adjacent elements in the graph often represent hierarchy boundaries for functional blocks.

The process extracts hierarchy and functionality from a netlist and helps create a high level model of a mixed-signal integrated circuit. The result is the conversion of a low (R, C, L, transistor) level netlist to a high-level human-readable netlist. The high-level netlist allows for the comparison of the subcircuts on a mixed signal integrated circuit to its datasheet, and for the discovery and detection of malicious or suspect circuitry in an IC.

In some embodiments, structural analysis on the netlist searches for repeating patterns in the enhanced connected graph. Once a pattern is identified, proper I/O boundaries are drawn to form a cell. Then all instances of the identified cell are found and the cell is placed in the library. At the same time, the netlist is updated with the new cell to recognize the added hierarchy information.

Figure 2:
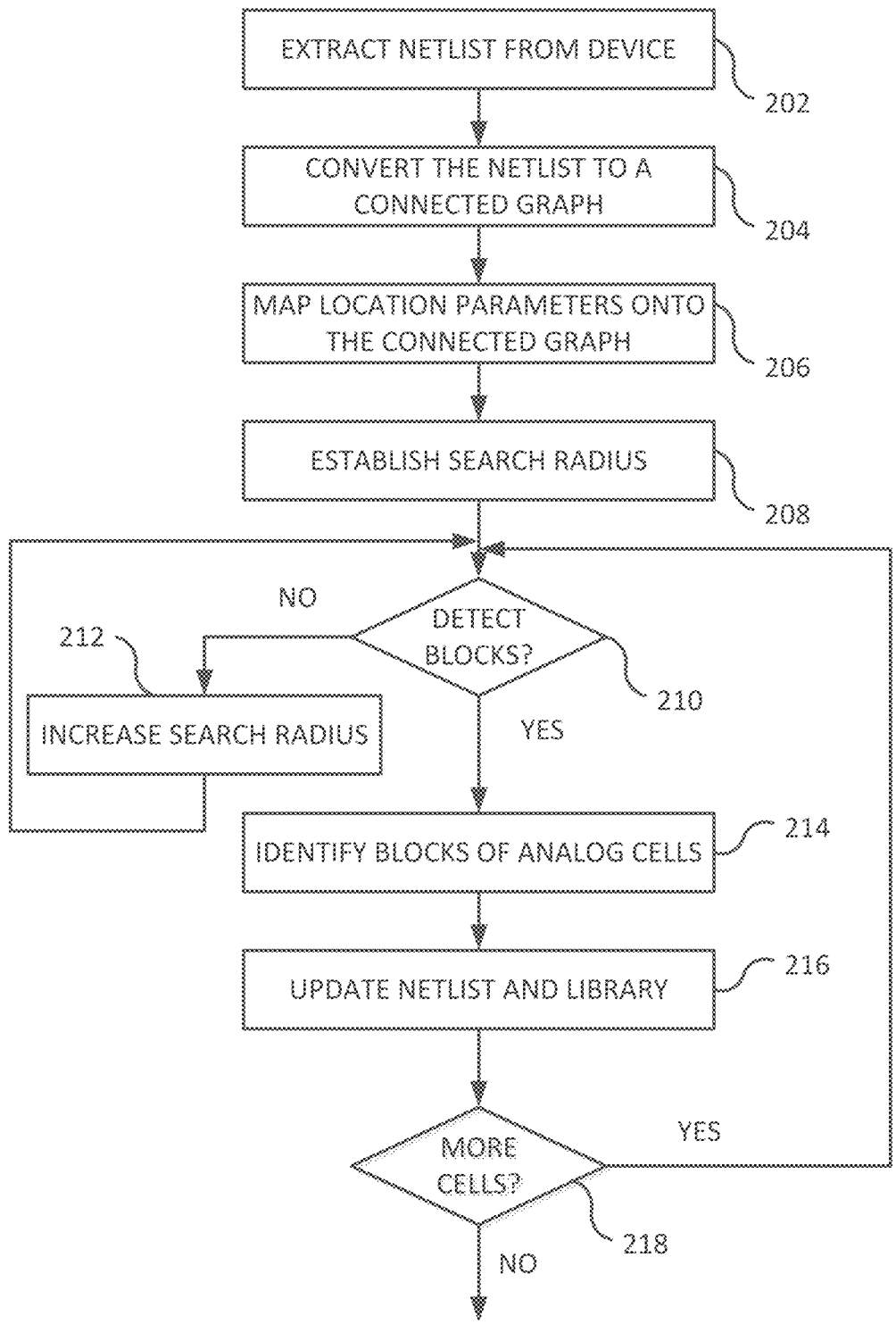
FIG. 2 illustrates a reverse synthesis method that uses location parameters.

In one embodiment, the overlay of XYZ spatial coordinates (taken from the layout) with the netlist is used for intelligent and optimized topological data analysis. One such embodiment is shown in FIG. 2. In the reverse synthesis method of FIG. 2, a netlist is extracted from a device under review at 202 and converted at 204 to a connected graph. Location parameters from the device under review are mapped over the connected graph at 206. Since circuit elements that work together to perform a function tend to be placed close together on the die, a search radius is selected at 208. At 210, a determination is made whether there are any such identifiable groups of analog cells with distance between neighboring cells less than the given radius. If not, the search radius is increased at 212. If blocks of analog cells are, however, found within the given search radius, the blocks are identified at 214 and replaced with a higher level abstraction at 216. In some embodiments, when a pattern is matched both the netlist and the library is updated simultaneously to incorporate the new hierarchy that represents the matched block. In addition, pre-existing libraries are updated with cells identified by auto cell identification. A check is made at 218 to see if there are more cells to be found and, if so, control moves to 210 for further block detection.

In one embodiment, the pattern search is performed in the layout domain as opposed to the netlist domain. The pattern search is based on the XYZ coordinates of the elements in the layout.

In one embodiment, the method allows for the use of "wild card" elements in the library to allow for variations in the implementation of the same analog function.

In one embodiment, a dynamic library is used. The library is updated with the netlist throughout the iterative process of recognizing patterns in the integrated circuit. In one embodiment, the methods implement a maximally automated hierarchy and functionality extraction process.

Figure 3:
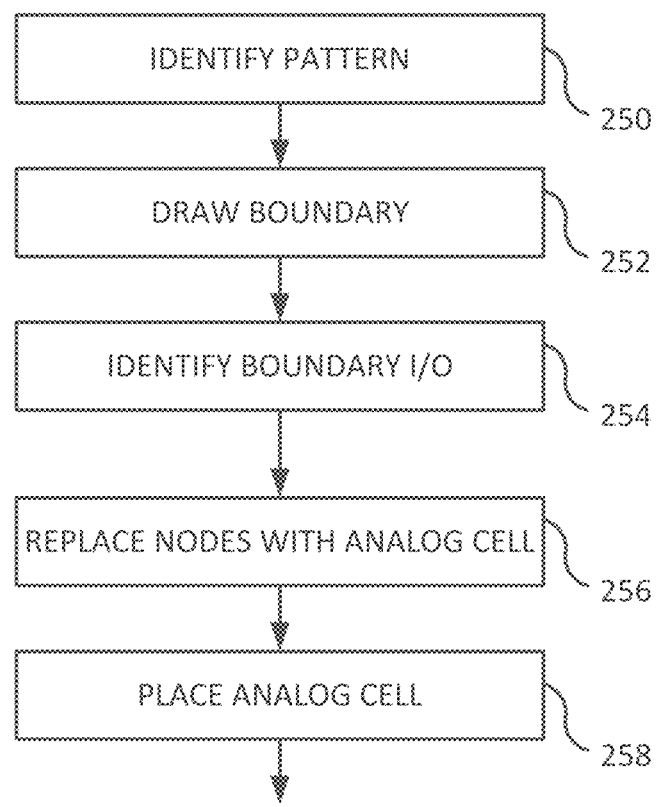
FIG. 3 illustrates pattern matching during reverse synthesis.

One embodiment of pattern matching is shown in FIG. 3. In the embodiment shown in FIG. 3, a computing device receives a connected graph of a netlist. The connected graph includes location attributes. At 250, the computing device identifies a pattern in the connected graph. At 252, the computing device draws a boundary around the pattern and identifies at 254 boundary I/O passing through that boundary. The equivalent analog cell is identified at 310—of FIG. 5 and used to replace the underlying nodes at 308 of FIG. 5.

Figure 4:
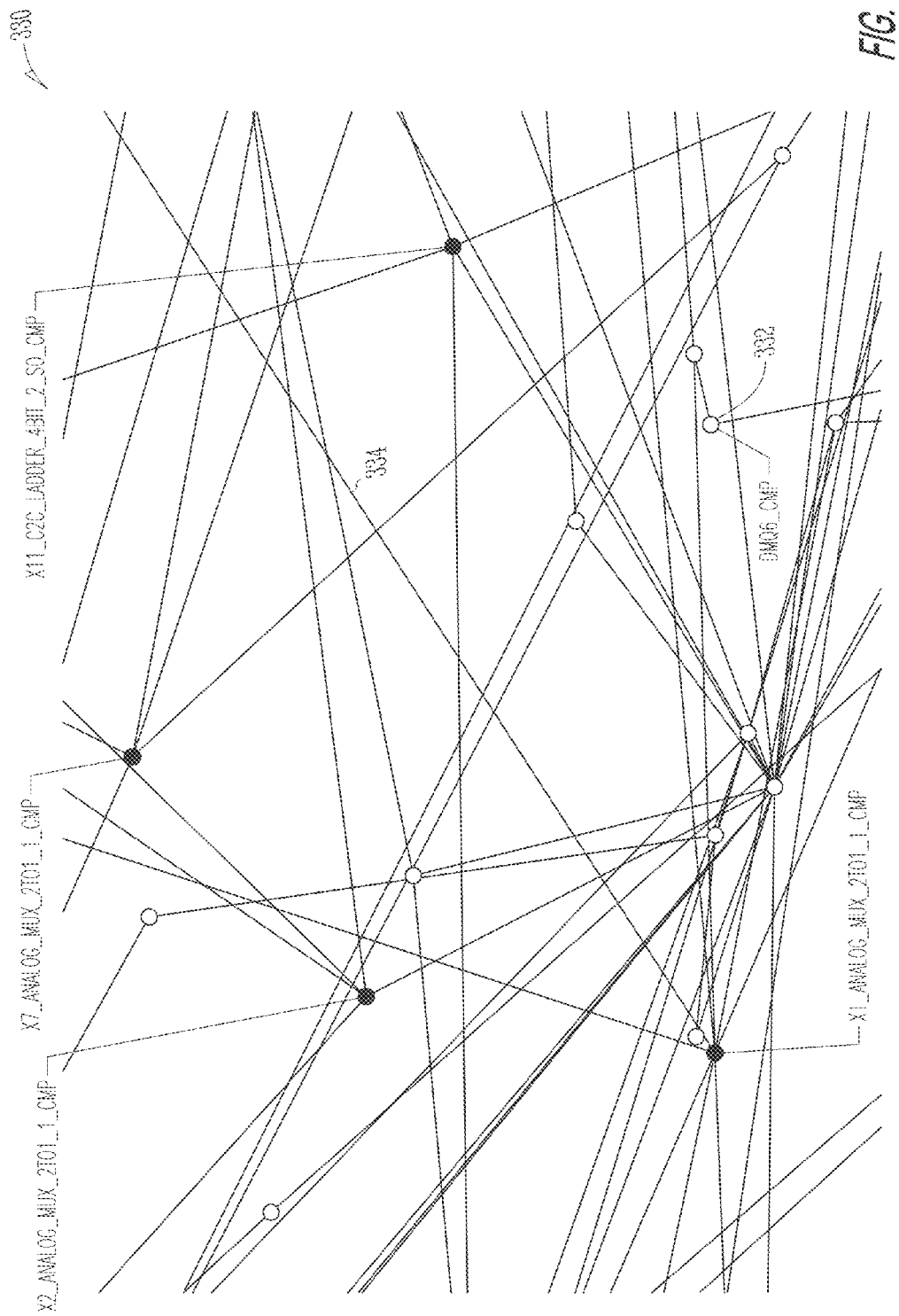
FIG. 4 illustrates a location enhanced connected graph representing a netlist.

An example of a connected graph 330 is shown in FIG. 4. In the example embodiment of FIG. 4, each node 332 is placed in a location proximate in space to its placement on the integrated circuit. In some embodiments, nodes 332 are placed in a three-dimensional representation of their location in a multi-layer integrated circuit. In the example shown in FIG. 4, connections between nodes 332 are shown as connection lines 334. As groups of nodes get replaced by higher-order functions, the nodes are replaced with a single node representing the high-order function.

Figure 5:
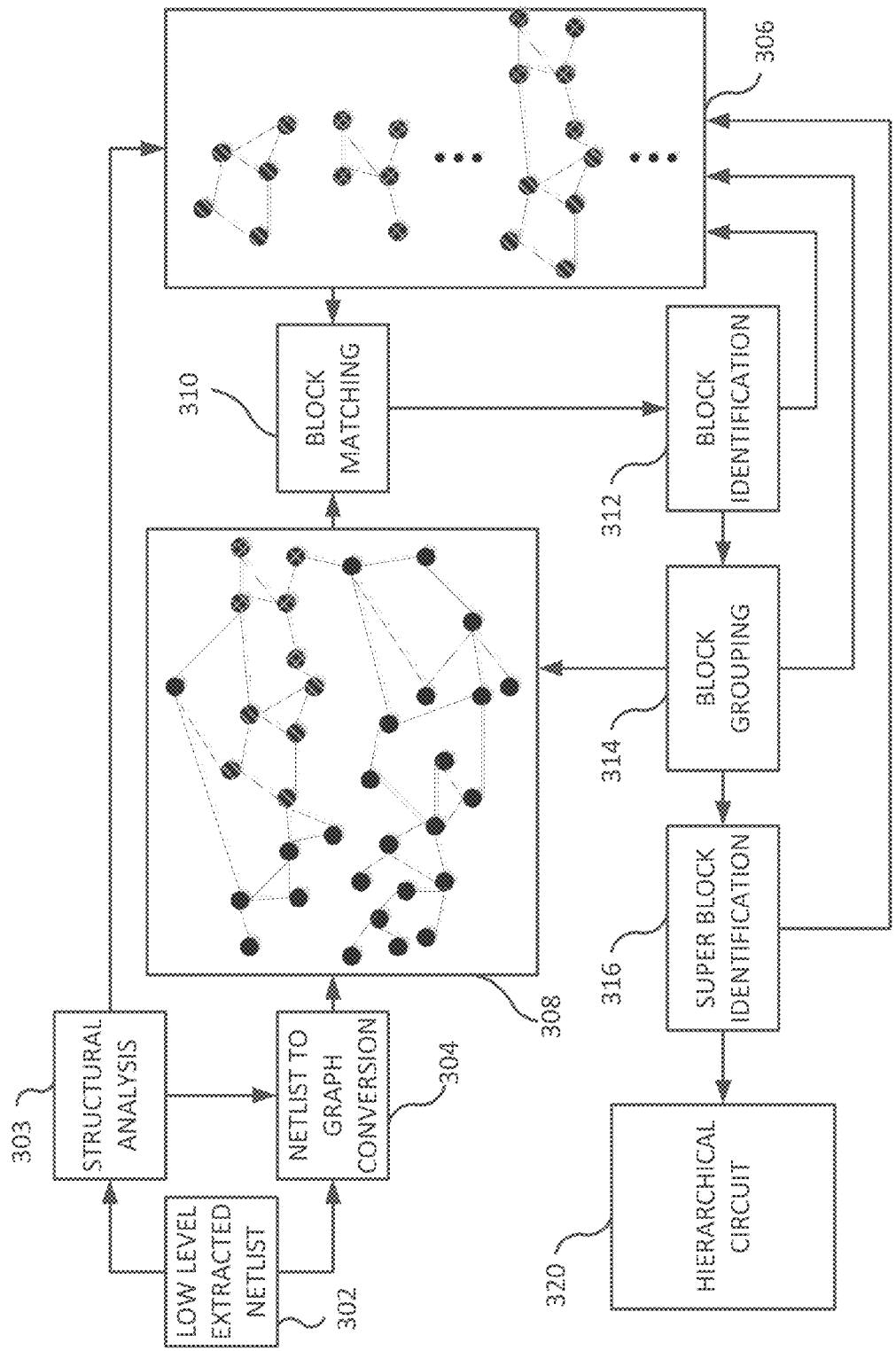
FIG. 5 illustrates a reverse synthesis method that uses Structural Auto Cell Identification.

In some embodiments, Structural Auto Cell Identification is used to augment the netlist when generating the connected graph. One such embodiment is shown in FIG. 5. In FIG. 5, low level extracted netlist 302 is fed to Structural Auto Cell Identification module 303 and netlist-to-graph conversion module 304. If Structural Auto Cell Identification module 303 identifies a cell, it forwards the identified cell to conversion module 304 and library 306. Conversion module 304 takes the extracted netlist and any cells identified by module 303, generates a connected graph 308 and adds location attributes before exporting it as enhanced graph 308. Pattern matching is done at 310 based on cells in library 306 and the result is exported to block identification module 312. New patterns identified at 312 are added to library 306. A check is made at 314 to see if any of the identified blocks can be further combined and, if so, the new higher-level blocks are identified at super block identification module 316 and added to library 306. As each higher-level function is identified and accepted, it is fed back into connected graph 308 at the appropriate location. The process is repeated until all higher level structures are identified and then output as hierarchical circuit 320.

An example of low to high level analog blocks is shown in table 350 of FIG. 6. These are examples of blocks that, in some embodiments, are identified by the process to extract hierarchy and functionality from a netlist.

Figure 7:
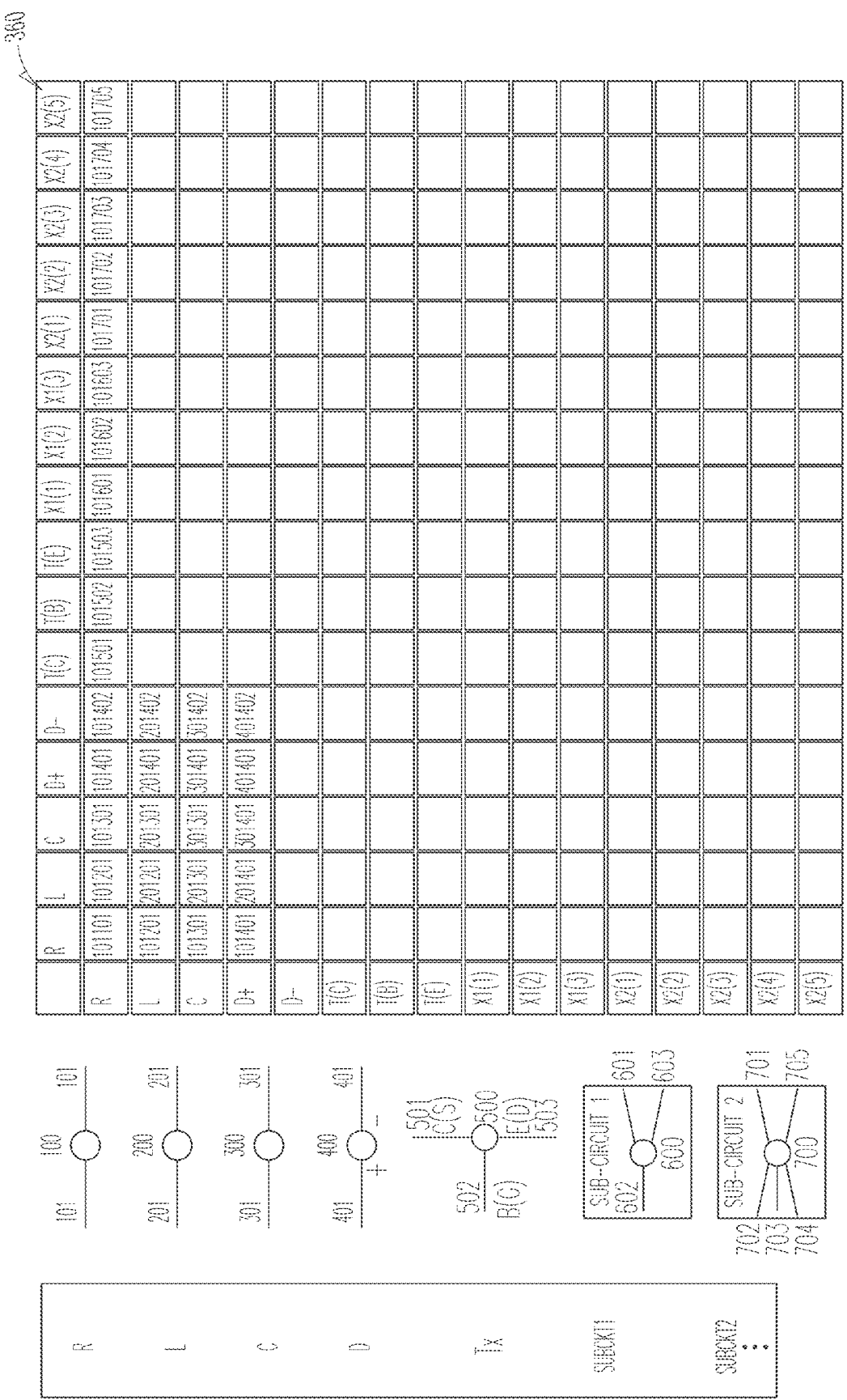
FIG. 7 illustrates a conceptual element ID assignment and ID look up table.

A conceptual element ID assignment and ID look up table is shown in FIG. 7. In the example embodiment shown in FIG. 7, each element R, L, C, D and Tx is replaced with a node having the same number of I/O. As nodes are combined into cells, the nodes are replaced with subcircuits (such as Subckt 1 and Subckt 2). Each subcircuit has as I/O the number of lines that would cross a boundary drawn around the subcircuit. Subckt 1 and Subckt 2 are replaced in the connected graph with nodes 600 and 700 respectively, with their respective connections and placed in the vicinity of their location in the integrated circuit. In some embodiments, the location selected for each subcircuit node is the center of the area occupied by the elements that make up the subcircuit. In other embodiments, the subcircuit node is placed closer to the nodes that provide the most I/O. In other embodiments, the subcircuit node is placed at the upper left corner x, y coordinate. In yet another embodiment, the node receives an upper left corner x, y coordinate and a lower right corner x, y coordinate. Such an approach can be used to approximate the size of the cell.

As can be seen in FIG. 7, in some embodiments, a look up table 360 defines each connection type. In the embodiment shown, each component type has its own unique ID and each connection type has its own unique ID as shown in look up table 360.

A mapping of circuit elements to graphical representation in form of subcircuit nodes is shown in FIG. 8. In the example embodiment of FIG. 8, the circuit elements of subcircuit 1 are converted from analog cells in netlist 410 to a graphical representation of those cells comprising nodes 332 and connections 334 in analog cell graphical representation 412 and from there to a single node 416 representing subcircuit 1. The circuit elements of subcircuit 2 and 3 are converted from analog cells in netlist 410 to a graphical representation of those cells comprising nodes 332 and connections 334 in analog cell graphical representation 412. From there they are replaced with a single node 418 and 420, respectively, representing subcircuits 2 and 3. New nodes 416, 418 and 420, with their connections 422 are then mapped back into the connected graph as discussed above.

Figure 9:
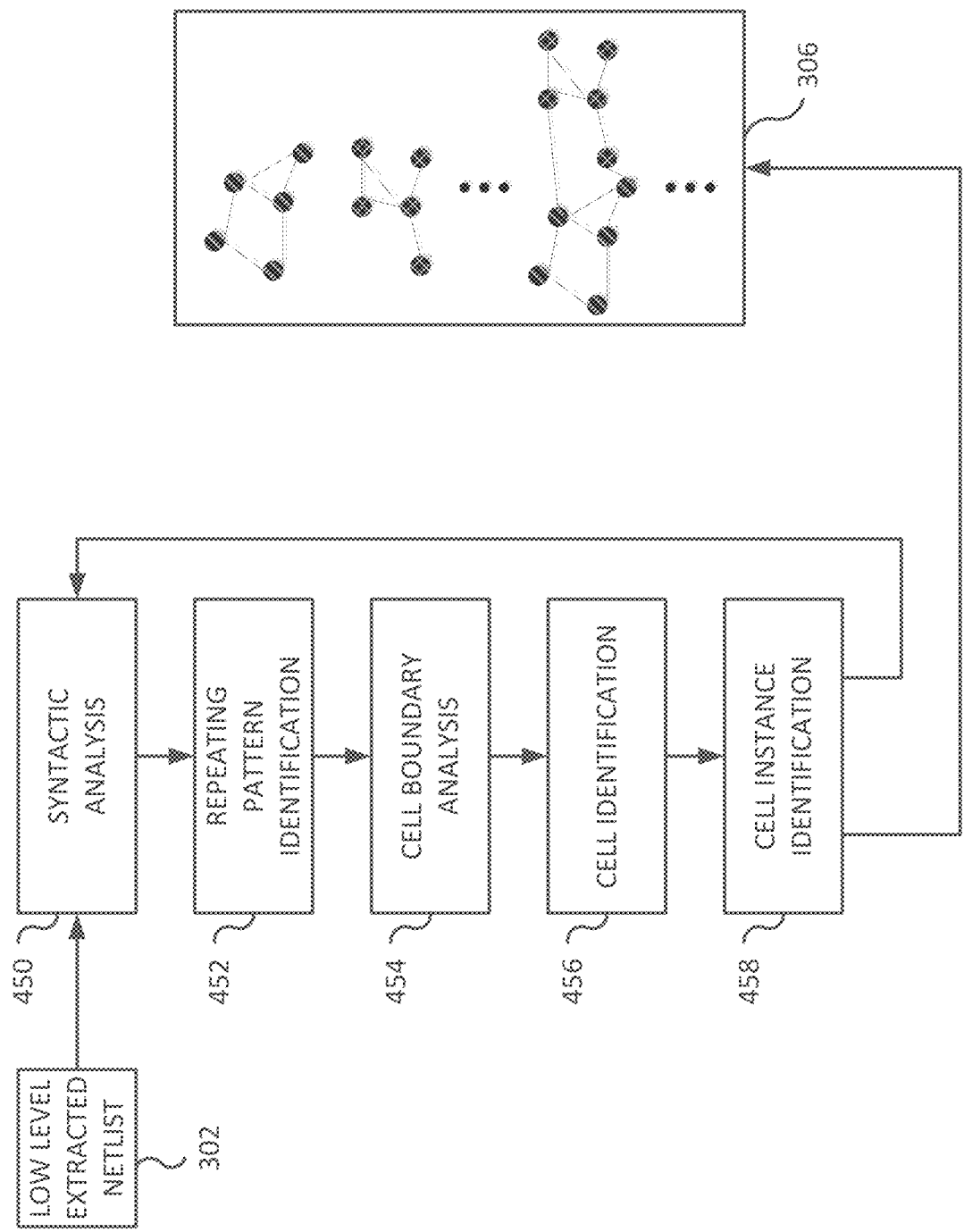
FIG. 9 illustrates Structural Auto Cell Identification.

In some embodiments, this mapping of circuit elements to subcircuits is done automatically at the netlist level using Structural Auto Cell Identification. In one example embodiment, such as is shown in FIG. 9, syntactic analysis is performed on netlist 302 at 450. At 452, a check is made for repeating patterns and an attempt is made to identify those patterns. At 454, a cell boundary is drawn around the patterns identified at 452 and an attempt is made at 456 to identify the cell. Each instance of the cell is identified at 458 and is used to replace the underlying circuit. New cells identified through this process are saved into library 306. The process repeats until all cells that can be identified have been identified and categorized.

In some embodiments, a list of extracted analog cells is compiled during the reverse synthesis process. An example of such a list is shown in FIG. 10. In the analog cell list 470 of FIG. 10, cells are added to the list as they are encountered in the integrated circuit. In one embodiment, the initial entries are identified through Structural Auto Cell Identification, as shown in FIG. 9.

Initial entries in analog cell list 470 are typically classified as low-level blocks. In the embodiment shown in FIG. 10, as cells are combined, they move up the hierarchy and are identified as mid-level blocks or mid-to-high level blocks, depending on their complexity. Examples of low-level blocks are shown in low-level block column 472 in FIG. 10. Examples of mid-level blocks are shown in mid-level block column 474 in FIG. 10. Examples of mid-to-high-level blocks are shown in mid-to-high-level block column 476 in FIG. 10.

Figure 11:
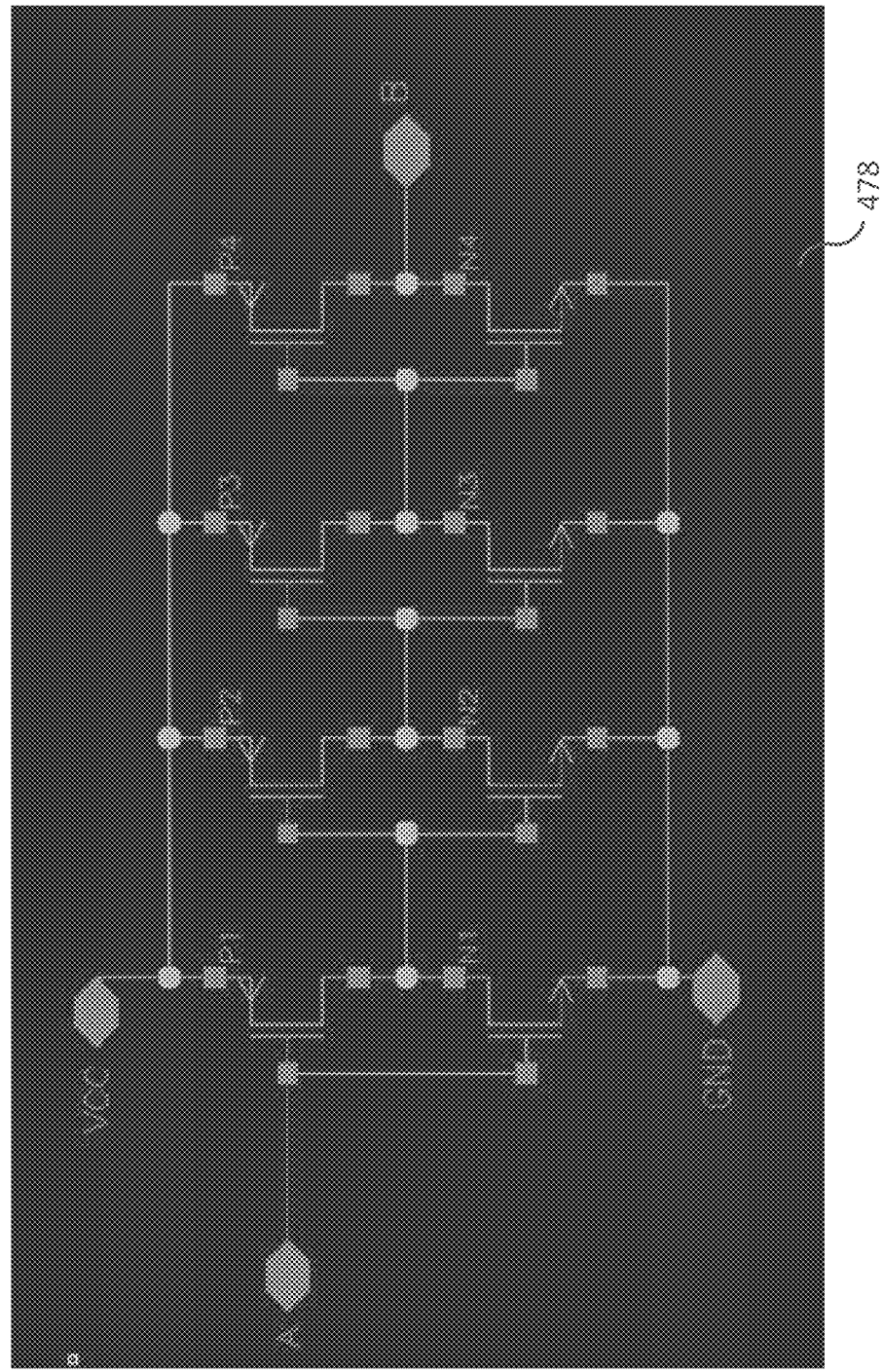
FIG. 11 illustrates an extracted circuit block from the analog cell list of FIG. 10.
Figure 13A:
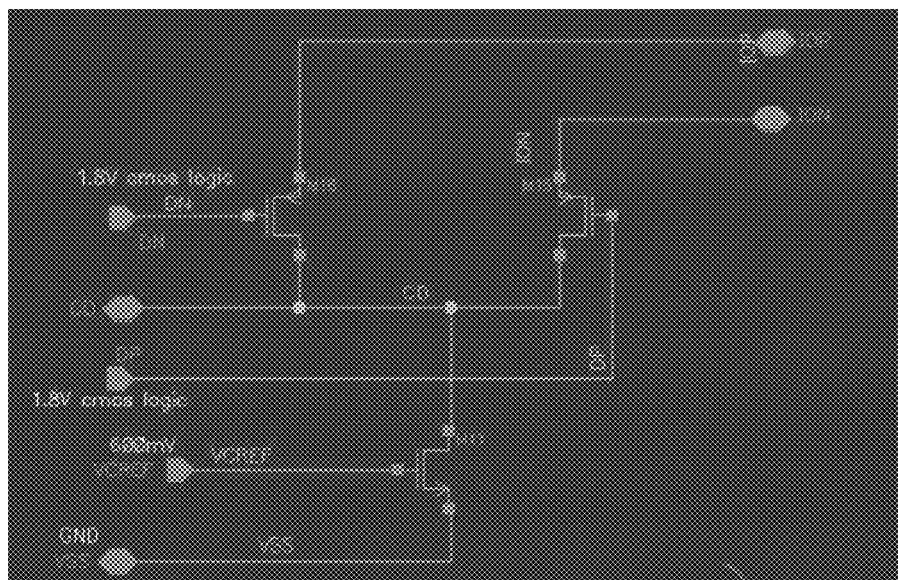
FIGS. 13a-f illustrate circuit blocks from the analog cell list of FIGS. 12a and b.
Figure 13B:
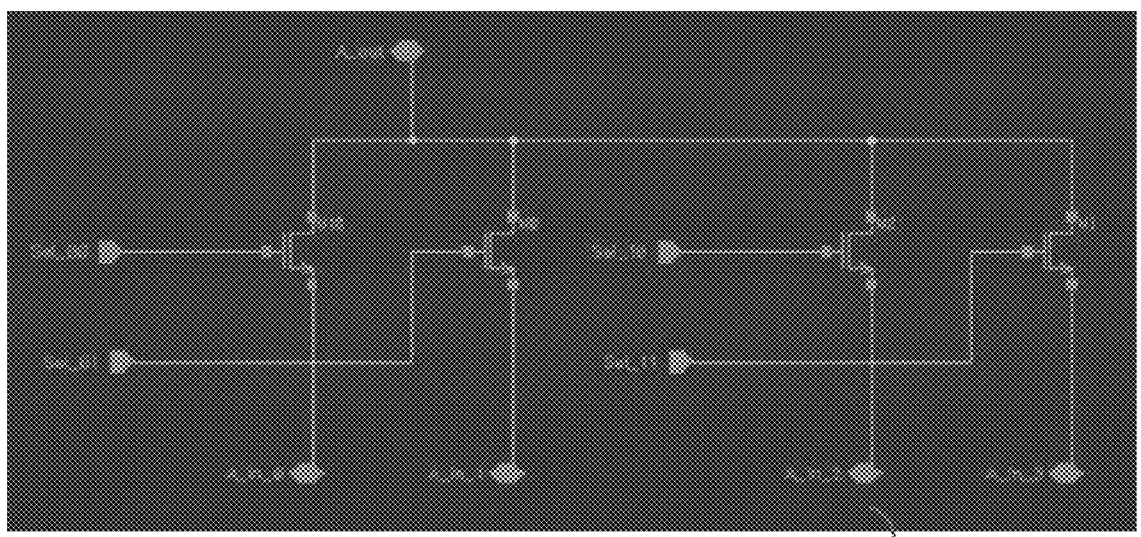
Figure 13D:
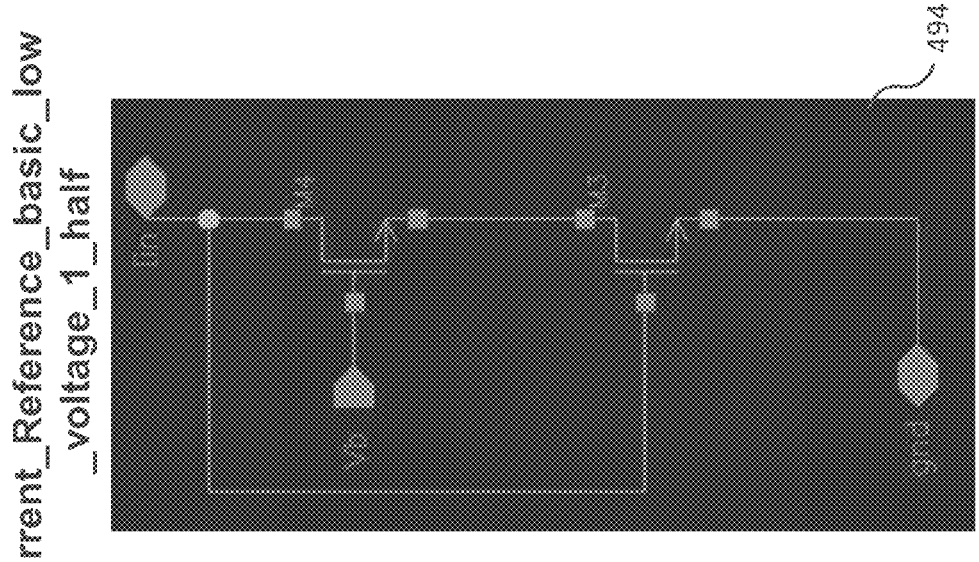
Figure 13C:
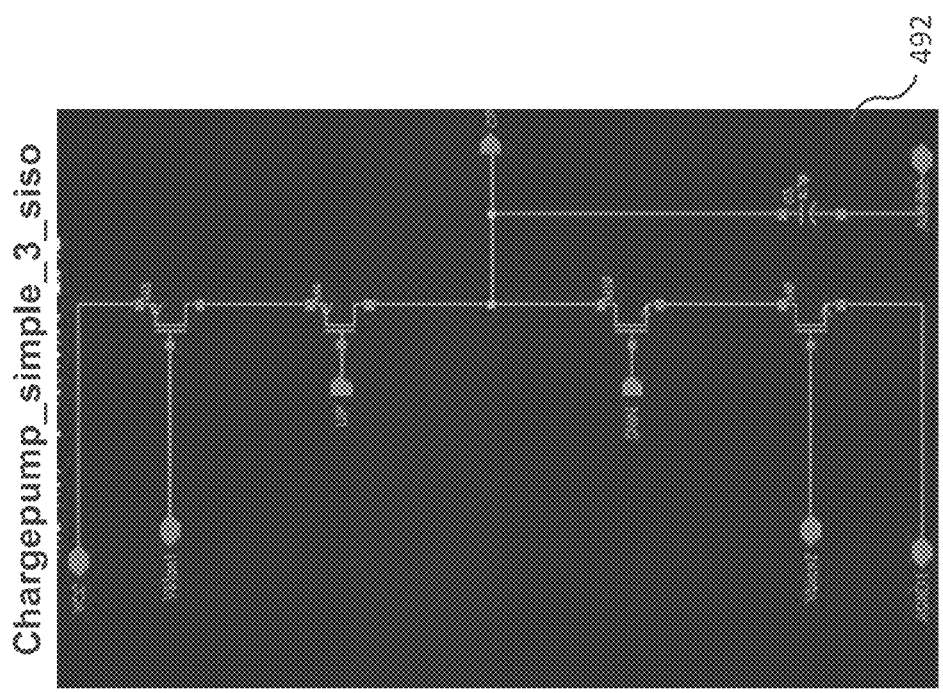
Figure 13F:
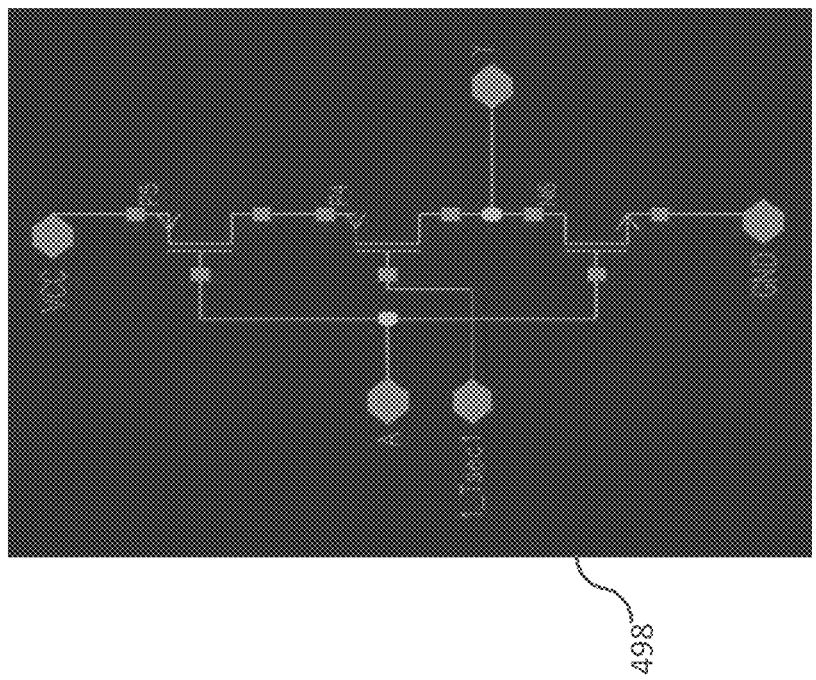
Figure 13E:
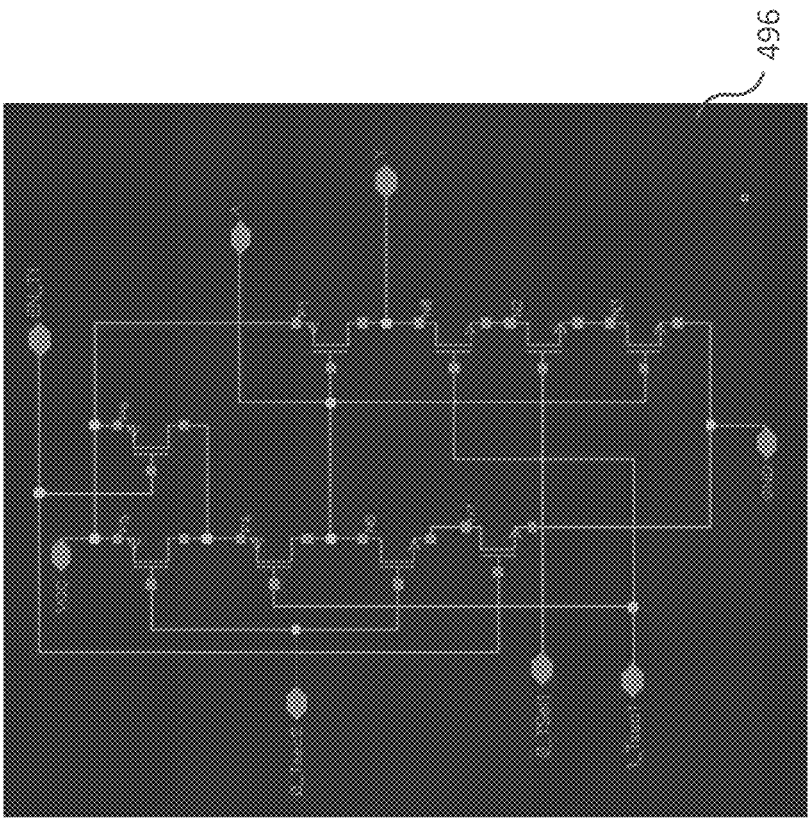

An example of an extracted block 478 is shown in FIG. 11. The block corresponds to item 1 in the analog cell list 470 of FIG. 10. In some embodiments, a list of analog cells is compiled during the reverse synthesis process. An example of such a list is shown in FIG. 10. The example shown in FIG. 10 is a Digital-to-Analog converter (DAC).

An example based on a phase-locked loop (PLL) is shown in FIGS. 12a-b and 13a-f. Once again, initial entries in analog cell list 480 are typically classified as low-level blocks. In the embodiment shown in FIGS. 12a and 12b, as cells are combined, they move up the hierarchy and are identified as mid-level blocks or mid-to-high level blocks, depending on their complexity. Examples of low-level blocks are shown in low-level block column 482 in FIGS. 12a and 12b. Examples of mid-level blocks are shown in mid-level block column 484 in FIGS. 12a and 12b. Examples of mid-to-high-level blocks are shown in mid-to-high-level block column 486 in FIGS. 12a and 12b.

Examples of extracted blocks for the PLL of FIGS. 12a and 12b are shown in FIGS. 13a-13f. The blocks correspond to analog cell list entries in FIGS. 12a and 12b. In the example shown in FIGS. 13a-13f, cell 488 of FIG. 13a corresponds to low-level entry 11 of list 480, cell 490 of FIG. 13b corresponds to low-level entry 10 of list 480, cell 492 of FIG. 13c corresponds to low-level entry 19 of list 480, cell 494 of FIG. 13d corresponds to low-level entry 12 of list 480, cell 496 of FIG. 13e corresponds to low-level entry 22 of list 480, and cell 498 of FIG. 13f corresponds to low-level entry 23 of list 480.

Figure 14:
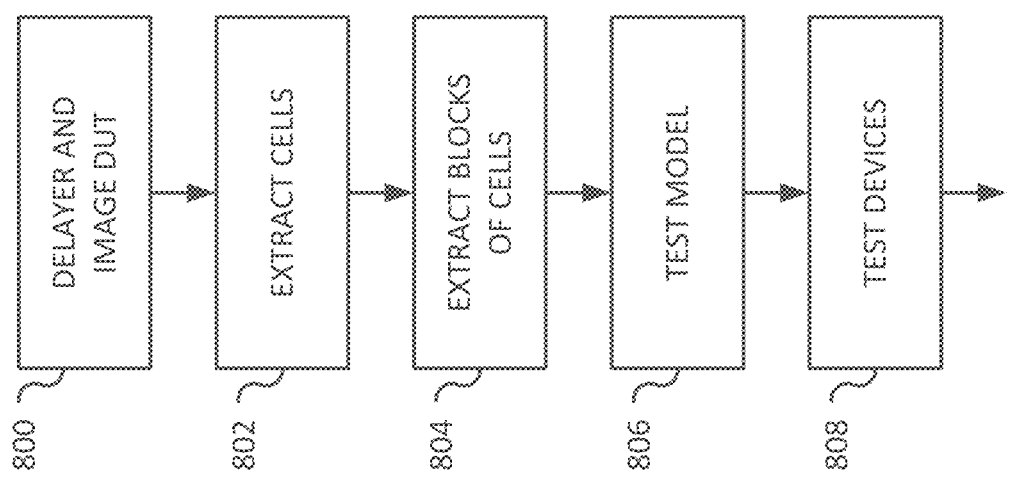
FIG. 14 illustrates a method of testing a batch of integrated circuits.

A method of testing a batch of integrated circuits is shown in FIG. 14. In the method of FIG. 14, a first integrated circuit from the batch of integrated circuits (the device under test or DUT) is analyzed at 800 and a low-level netlist is extracted. In one embodiment, the netlist is extracted by imaging the integrated circuit.

At 802 analog cells are identified and replaced with a node, and at 804, blocks of cells are identified and replaced with a node. The process repeats until cells have been combined as much as possible. The result is an analog functional block netlist including circuits such as amplifiers, mixers, phase-locked loops, and analog-to-digital converters.

At 806, the analog functional block netlist is tested to determine if it operates like the DUT. If so, test vectors are generated for testing the remaining integrated circuits in the batch of integrated circuits and the tests are run on the remaining integrated circuits at 808.

The method of FIG. 14 can also be used for mixed-signal devices. For such devices, the DUT is analyzed at 800 and a low-level netlist is extracted. In one embodiment custom digital circuits are treated and extracted like analog circuits.

At 804 both analog and digital cells are identified and replaced with a node, and at 804, blocks of cells are identified and replaced with a node. The process repeats until cells have been combined as much as possible. The result is a mixed analog and digital functional block netlist including analog circuits such as amplifiers, mixers, and phase-locked loops, and analog-to-digital converters and digital circuits such as a built-in-self test, an I2C programming interface, and a RS232 serial port.

At 806, the mixed analog and digital functional block netlist is tested to determine if it operates like the DUT. If so, test vectors are generated for testing the remaining integrated circuits in the batch of integrated circuits and the tests are run on the remaining integrated circuits at 808.

Figure 15:
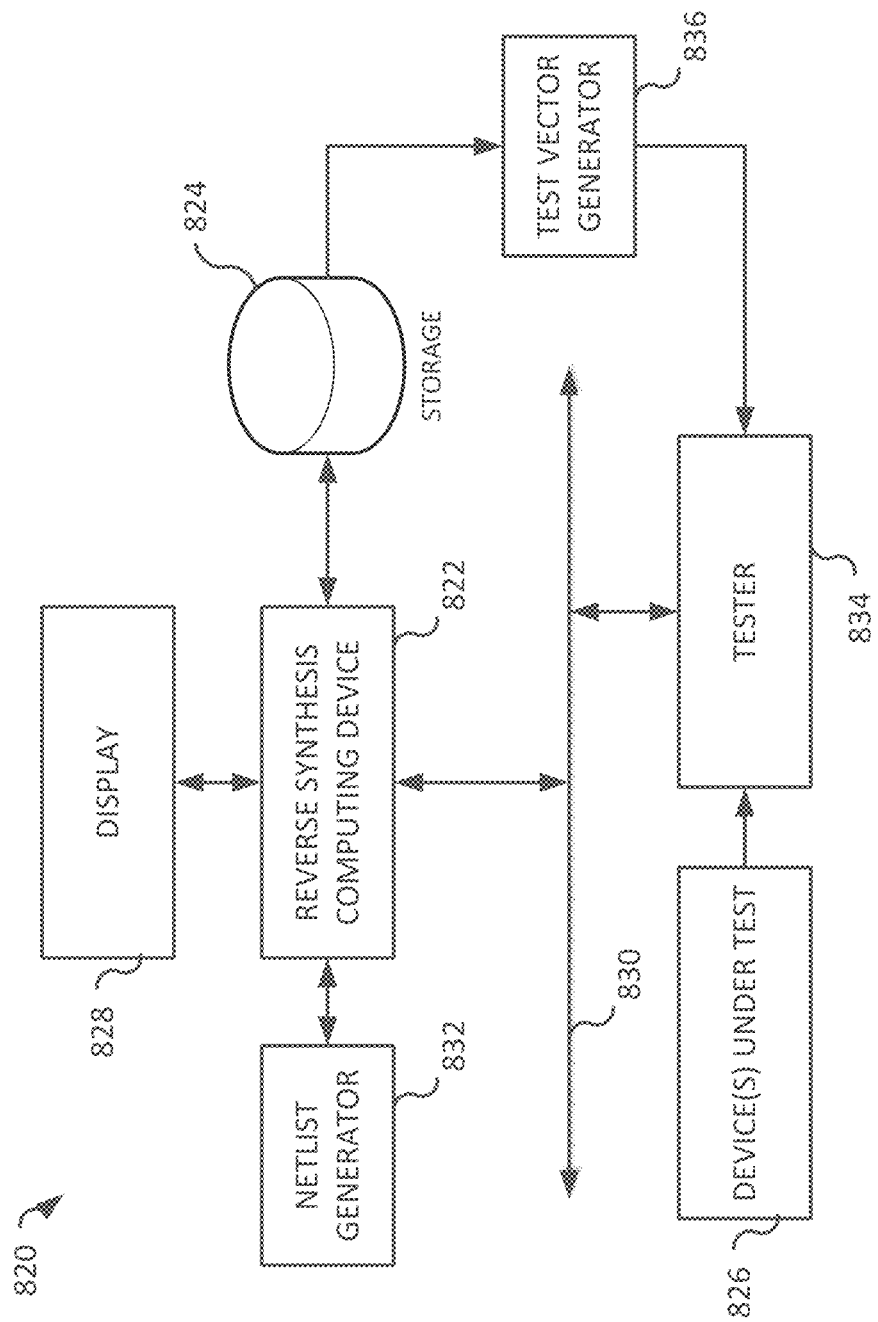
FIG. 15 illustrates a system for performing reverse synthesis and test on an integrated circuit.

A system for performing reverse synthesis on an integrated circuit is shown in FIG. 15. In system 820 of FIG. 15, a reverse synthesis computing device 822 is connected to storage 824, netlist generator 832 and a display 828. Netlist generator 832 generates the low-level extracted netlist 302 of FIGS. 5 and 9. In some embodiments, generator 832 includes a Focused Ion Beam (FIB)/Scanning Electron Microscope (SEM) system used to delayer and image the integrated circuit. In one such embodiment, the output of generator 832 is a three-dimensional stackup of SEM images. In some embodiments, the SEM images are combined with parameters of an integrated circuit design kit corresponding to the device under test and with a functional datasheet to form the low-level extracted netlist. Computing device 822 applies reverse synthesis to the extracted netlist as described above to arrive at a hierarchical and function model of the integrated circuit under test.

The hierarchical and function model of the integrated circuit is then stored in storage 824 and is used by test vector generator 836 to generate test vectors. In some embodiments, system 820 includes a tester 834 that receives test vectors from test vector generator 836 or computing device 822 and tests other integrated circuits from the batch of integrated circuits.

Figure 16:
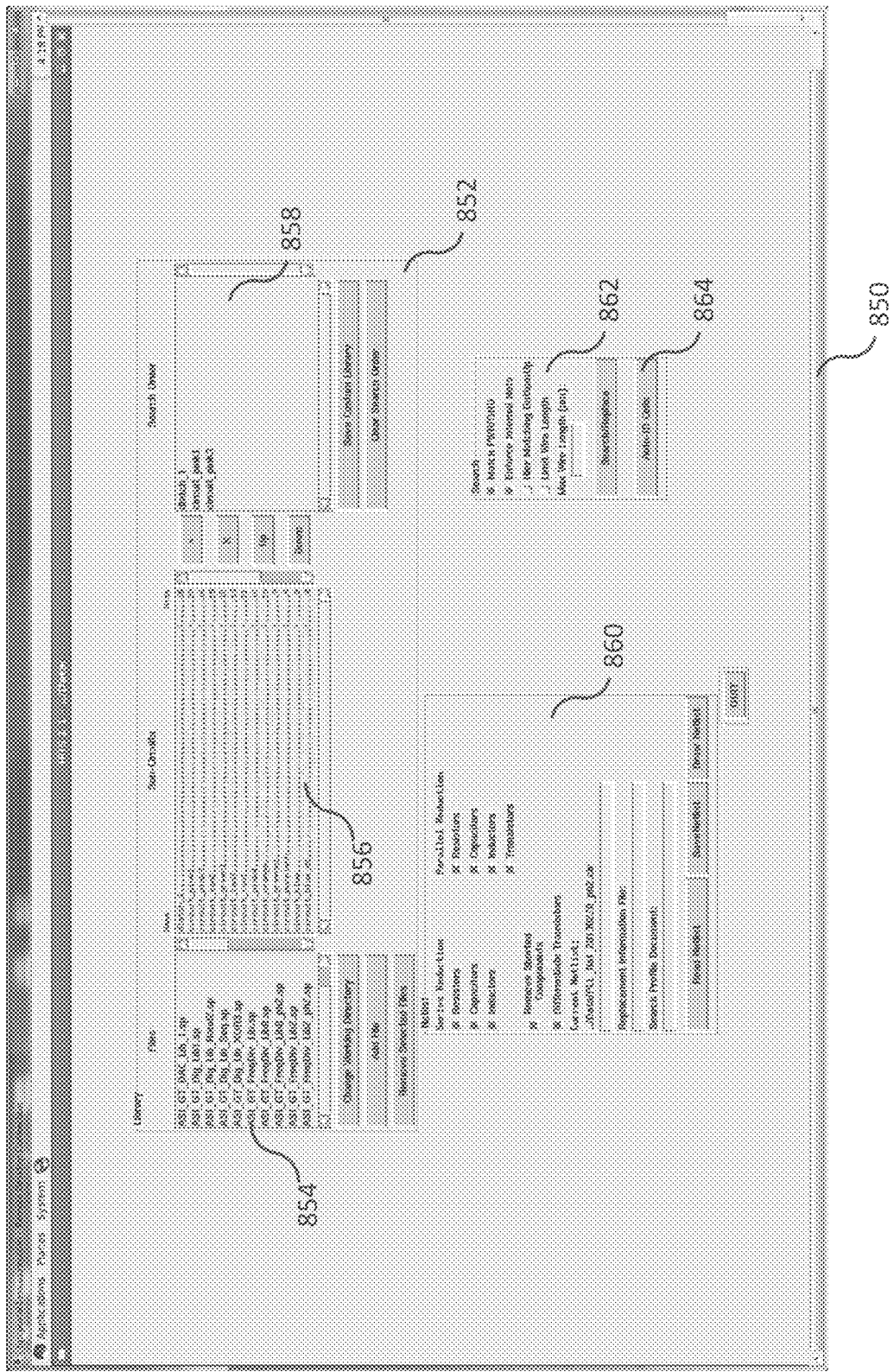
FIG. 16 illustrates a graphical user interface (GUI) for the reverse synthesis tool to extract hierarchy and functionality.

In some embodiments, a graphical user interface (GUI) is provided to help the user to configure reverse synthesis computing device 822 for reverse synthesis. In one embodiment, as is shown in FIG. 16, GUI 850 includes a library file interface 852 for opening library files 854. In some embodiments, library files include representations of different levels of analog cells. In some embodiments, these representations are used during the reverse synthesis process to pattern match the smallest cells in the library to cells in the integrated circuit under test for bottom up review. When a match is made, the nodes that make up the match are replaced with a single node as discussed above and the I/O is updated to reflect the I/O of the new cell. As cells are combined through the reverse synthesis process, newly combined cells are added to library file 854 for future use. Each new node has its own attributes. In some embodiments, the attributes include the number of terminals of the node, the x-y location and an indication whether the terminals are interchangeable.

In some embodiments, system 820 performs a top-down approach in which the largest blocks in the library are compared against the integrated circuit under test and are used to replace portions of the integrated circuit netlist when there is a match. For top-down approaches, there is no need to update the library since you already are at the top end of the library.

In the embodiment shown in FIG. 16, new library files can be added as needed. In some embodiments, library files are developed by reviewing circuit designs in documents such as textbooks, product manuals and design documents. In some embodiments the libraries can be custom or standard digital libraries.

GUI 850 of FIG. 16 also includes a display mechanism 856 for reviewing the contents of a library file 854 and a search order mechanism 858 for selecting the order in which patterns are matched against the integrated device under test. In some embodiments, a netlist processing mechanism 860 provides controls for process a netlist, while search mechanism 862 allows one to search and replace selected circuit elements.

In one embodiment, as is shown in FIG. 16, Structural Auto Cell Identification can be used to process the netlist by activating button 864. In another embodiment the netlist can be reduced and simplified via series reduction prior to reverse synthesis. In series reduction series resistors, capacitors or inductors are combined into one element. In another embodiment the netlist can be reduced and simplified via parallel reduction prior to reverse synthesis. In parallel reduction parallel resistors, capacitors or inductors are combined into one element. In another embodiment shorted or open elements are removed under user control from the netlist in order to simplify the netlist for processing. In another embodiment differentiation can be made between NMOS and PMOS transistors during pattern matching. In another embodiment the PMOS and NMOS transistors are treated equally during pattern matching. The reverse synthesis process is equally applicable to MOS and Bipolar Junction Transistors (BJT) and subsequently to MOS, Bipolar and BICMOS netlists. In another embodiment all power and Ground forms are treated equally during pattern matching. In another embodiment differentiation can be made between different types of power forms and Grounds, for instance VCC, VDD, AGND, DGND, etc. In another embodiment the library cells are treated like black boxes with the exact topology of all internal nets enforced. In such a case when matching internal nets no extra net can branch out of the internal nets.

Figure 17:
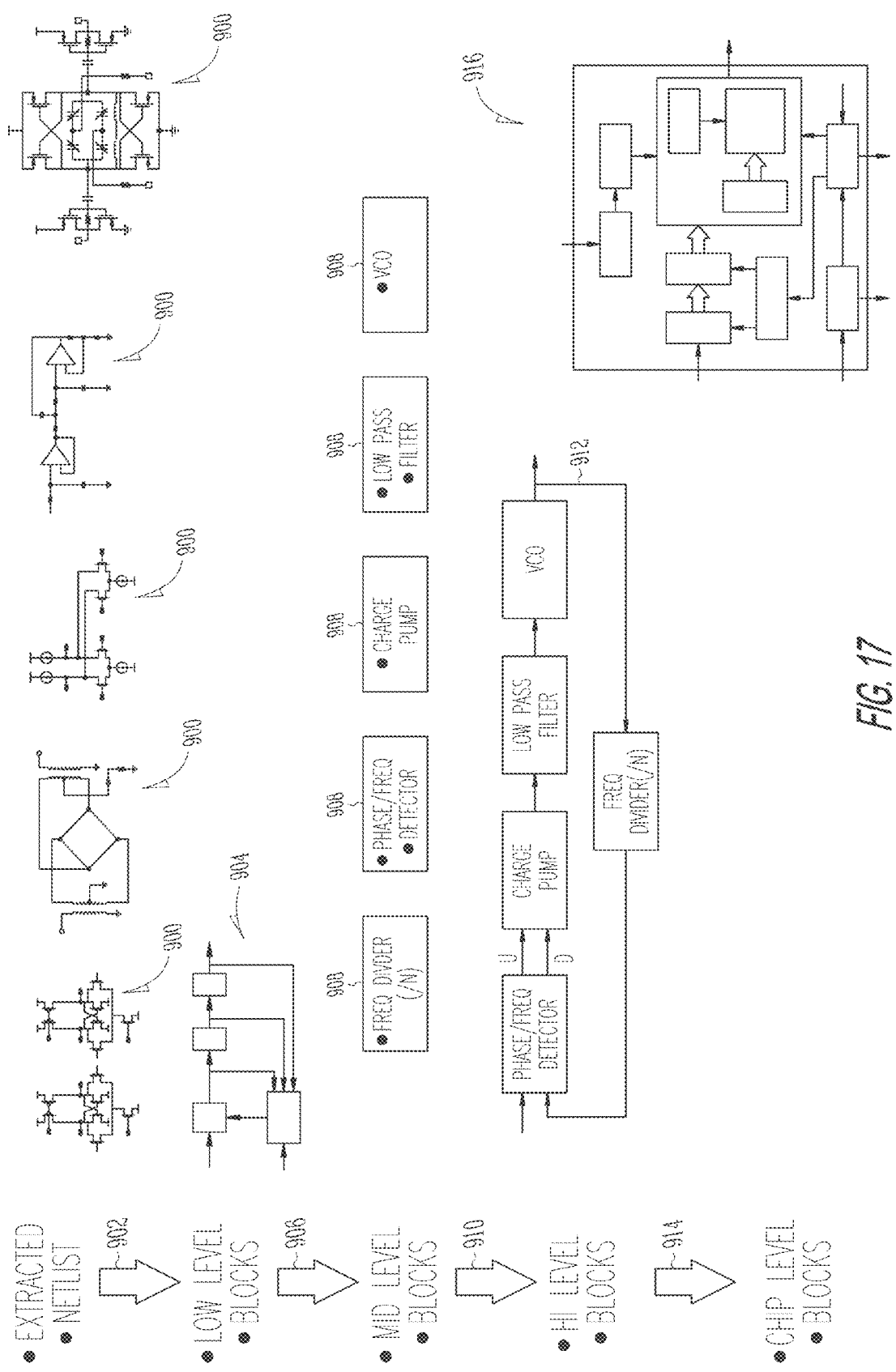
FIG. 17 is a graphical representation of a bottom-up method of extracting functional and hierarchical information from an integrated circuit.

FIG. 17 is a graphical representation of a bottom-up method of extracting functional and hierarchical information from an integrated circuit. An extracted netlist is processed at 902 to recognize low-level blocks 904. Larger cells are processed at 906 from either low-level blocks 904 or from circuit elements 900 to recognize mid-level blocks 908. Mid-level blocks 908 cells are processed at 910 to recognize high-level blocks 912. High-level blocks 912 cells are processed at 914 to recognize chip-level blocks 916.

As shown in FIG. 17, topological data analysis on a representation of an integrated circuit is used to locate and identify simple to complex patterns in order to extract hierarchy and functionality from the netlist. In some embodiments, the analysis is done directly on the netlist. In other embodiments, the analysis is done through pattern matching structures with a graphical representation of the integrated circuit as shown in FIG. 4.

As noted above, the process can be used effectively to process analog as well as mixed signal circuits.

The process extracts hierarchy and functionality from a netlist and helps create a high level model of a mixed-signal integrated circuit. The result is the conversion of a low (R, C, L, transistor) level netlist to a high-level human-readable netlist. The high-level netlist allows for the comparison of the resident circuit on a mixed signal integrated circuit to its datasheet, and for the discovery and detection of malicious or suspect circuitry in an IC.

Embodiments may be implemented in one or a combination of hardware, firmware and software. Embodiments may also be implemented as instructions stored on a computer-readable storage device, such as storage 824, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, the computing device 822 may include one or more processors and may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A method, comprising:
    receiving into a computer processor a netlist;
    converting using the computer processor the netlist to a connected graph;
    identifying using the computer processor blocks of cells within the connected graph; and
    forming with the computer processor a circuit model from the blocks of cells, wherein forming includes iteratively building more complex blocks of cells from simpler blocks of cells;
    wherein identifying blocks of cells within the connected graph includes performing pattern matching based on patterns stored in a library;
    wherein the patterns include wild card nodes, wherein any node type in the integrated circuit can be used to satisfy the wild card node; and
    wherein the patterns include wild card connections, wherein any connection type in the integrated circuit can be used to satisfy the wild card connection.

2. The method of claim 1, wherein converting the netlist to a connected graph includes overlaying location parameters on the connected graph.

3. The method of claim 2, wherein identifying blocks of cells within the connected graph includes using Structural Auto Cell Identification to identify blocks of cells.

4. The method of claim 2, wherein the method further includes testing the circuit model to verify it operates like a device under review.

5. The method of claim 1, wherein the method further includes testing the circuit model to verify it operates like a device under review.

6. A method, comprising:
    converting using a computer processor a netlist to a connected graph;
    iteratively identifying using the computer processor blocks of cells within the connected graph; and
    forming using the computer processor a circuit model from the identified blocks of cells;

wherein custom digital cells are treated like analog cells; and wherein forming a circuit model includes selecting whether to enforce the exact topology of internal nets of a library cell.

7. The method of claim 6, wherein iteratively identifying blocks of cells within the connected graph includes building more complex blocks of cells from simpler blocks of cells.

8. The method of claim 7, wherein converting the netlist to a connected graph includes overlaying location parameters on the connected graph.

9. The method of claim 8, wherein identifying blocks of cells within the connected graph includes performing pattern matching based on patterns stored in a library.

10. The method of claim 9, wherein the library includes wild-cards.

11. The method of claim 6, wherein the netlist is expressed in a hardware description language.

12. The method of claim 9, wherein identifying blocks of cells within the connected graph includes combining two or more blocks to form a new block and saving the new block to the library.

13. The method of claim 6, wherein identifying blocks of cells within the connected graph includes using Structural Auto Cell Identification to identify blocks of cells.

14. The method of claim 6, wherein the input netlist includes digital cells.

15. The method of claim 14, wherein the library includes analog and digital cells.

16. The method of claim 6, wherein forming a circuit model includes selecting whether the reverse synthesis process differentiates between PMOS and NMOS (PNP and NPN) transistors.

17. The method of claim 6, wherein forming a circuit model includes selecting whether to differentiate between different power forms and different Ground forms.

18. The method of claim 6, wherein the method further includes testing the circuit model to verify it operates like a device under review.

19. The method of claim 6, wherein iteratively identifying blocks of cells within the connected graph includes performing a top-down analysis of the blocks of cells to identify complex blocks of cells.

20. The method of claim 19, wherein converting the netlist to a connected graph includes overlaying location parameters on the connected graph.

21. The method of claim 20, wherein identifying blocks of cells within the connected graph includes performing pattern matching based on patterns stored in a library.

22. A reverse synthesis system, comprising:
a netlist source;
a computing device connected to the netlist source; and
an output device connected to the computing device;
wherein the computing device receives a netlist from the netlist source, converts the netlist to a connected graph, identifies blocks of cells within the connected graph, and forms a circuit model from the blocks of cells, wherein forming includes iteratively building more complex blocks of cells from simpler blocks of cells;
wherein custom digital cells are treated like analog cells; and
wherein forming a circuit model includes selecting whether to enforce the exact topology of internal nets of a library cell.

23. The reverse synthesis system of claim 22, wherein the netlist source is a netlist generator that delayers and images an integrated circuit.

24. The reverse synthesis system of claim 22, wherein the output device includes a display, wherein the display displays a graphical user interface, wherein the graphical user interface interacts with the computing device to control reverse synthesis.

25. The reverse synthesis system of claim 22, wherein the output device includes an integrated circuit tester, wherein the integrated circuit tester receives test vectors generated during reverse synthesis and applies those test vectors to a device under test.

* * * * *